United States Patent [19]

Gulick

[11] Patent Number: 5,535,281
[45] Date of Patent: Jul. 9, 1996

[54] ANALOG INTEGRATED CIRCUIT

[75] Inventor: Dale Gulick, Austin, Tex.

[73] Assignee: Advanced Micro Devices, Inc., Austin, Tex.

[21] Appl. No.: 264,883

[22] Filed: Jun. 24, 1994

[51] Int. Cl.$^6$ ....................................... H04S 3/00
[52] U.S. Cl. ............................... 381/28; 381/122
[58] Field of Search ............................ 381/28, 10, 11, 381/26, 22, 120, 80, 81, 84, 85, 77, 122; 330/297, 307, 129, 128

[56] References Cited

U.S. PATENT DOCUMENTS 5,155,770  10/1992  Maejima ................... 381/11

OTHER PUBLICATIONS

Samsung Semiconductor OmniWave™ Multimedia Audio KS0161, Rev. A, Nov. 1994.
OPTi/MediaCHIPS Multimedia Audio Controller 82C929, Mar. 29, 1993 Spec Sheet.
Analog Devices Parallel–Port 16–Bit SoundPort Stero Codec AD 1848, Rev. A.
Crystal Semiconductor Corporation Parallel Interface, Multimedia Audio Codec CS–4231 Mar. 1993.

Primary Examiner—Scott A. Rogers
Assistant Examiner—Jerome Grant, II
Attorney, Agent, or Firm—Fulbright & Jaworski

[57] ABSTRACT

A single monolithic integrated circuit which may be used with an external audio integrated circuit to provide various analog support functions for the external audio integrated circuit, including, microphone amplifier circuitry, speaker/headphone drivers and power control.

13 Claims, 2 Drawing Sheets

ANALOG INTEGRATED CIRCUIT

BACKGROUND OF THE INVENTION

1. Field of the Invention

This invention relates to a monolithic analog integrated circuit. More particularly, this invention relates to an analog integrated circuit which provides all necessary analog support functions, including stereo and mono input and output and enables, for use with an audio signal processing integrated circuit.

2. Discussion of the Related Technology

Multimedia devices have a greater presence in the home entertainment, personal computer and business environments. Audio signal processing boards, used in personal computers for home and business, are also becoming widespread. A need has arisen for a single monolithic analog integrated circuit device to provide all necessary analog support functions for an audio board, or audio integrated circuit, especially in certain environments, such as PCMIA cards and PC motherboards, where board space and/or power requirements are limited.

The need exists for an analog integrated circuit to support an external audio IC, where the audio IC processes analog and digital audio signals by encoding and decoding the audio signals, where the analog integrated support circuit provides analog power support functions for the audio IC, such as microphone, stereo and mono inputs and microphone, stereo and mono outputs, and would utilize various enable/mute signals from the audio IC to control power-down and other power management functions on the analog integrated circuit.

SUMMARY OF THE INVENTION

The present invention for a single monolithic analog integrated circuit provides support for an external audio signal processing integrated circuit, or audio board, in a PC environment. The present invention could also be used in certain environments, such as PCMIA cards and PC motherboards, where board space and/or power constraint requirements exist. Because of reduced board space, it is necessary to minimize the number of discrete components which should also reduce noise and clicks on power-up. The analog IC can operate in either a 3.3 or 5.5 volt environment.

This invention includes microphone, stereo and mono analog signal inputs with microphone, stereo and mono analog outputs. The invention also includes power supply and ground pins to operate the device. Various mute and enable signals are input to the device from a companion audio signal processing integrated circuit, or audio board, to provide control for the present invention. Voltage references would be available on the analog IC.

Microphone amplifiers, speakers/headphone drivers and power control are provided on the analog IC. A global enable signal allows power consumption to be reduced to virtually zero. Output mute control signals from an external audio signal processing IC disable analog IC outputs and reduce power consumed in the output drivers while keeping the DC bias level present on the output pins. This function prevents clicks and pops when the output circuits are powered-up.

Power management and reduced board space are the basic advantages provided by the analog IC contrasted with discrete operational amplifier circuits previously used as microphone amplifiers and speaker/headphone driver ICs. The present invention also reduces the number of discrete resistors and capacitors needed to perform analog audio functions in a PC environment.

DETAILED DESCRIPTION OF THE PREFERRED EMBODIMENT

Figure 1:
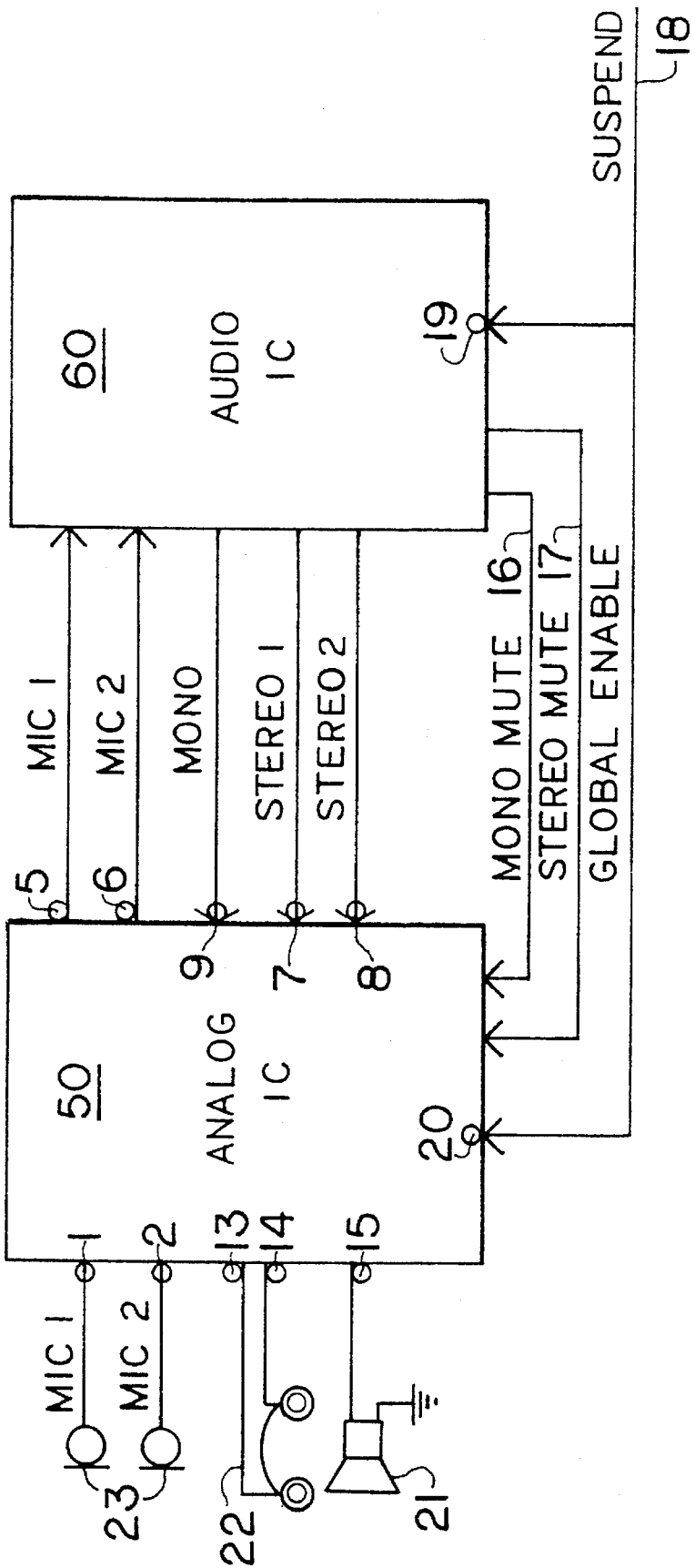
FIG. 1 is a schematic representation of the various connections between the analog IC of the present invention and an external companion audio signal processing integrated circuit.

Referring to FIG. 1, the signal conductivity between the analog IC 50 and the companion audio signal processing integrated circuit (audio IC) 60, which may be contained on the same motherboard, is illustrated. Audio IC 60 may include a CODEC module, which includes D/A circuitry and A/D circuitry, and a synthesizer module, preferably a wavetable synthesizer for processing audio signals. Microphone signals input from external microphones 23 to microphone input terminals 1, 2 on analog IC 50 pass through operational amplifier circuits 3 and 4, respectively (FIG. 2), and are available as microphone output signals on microphone output terminals 5, 6, respectively, on analog IC 50. The microphone output signals are input to companion audio IC 60 for processing. Stereo input signals output from audio IC 60 are present at stereo input terminals 7, 8 on analog IC 50, pass through isolation amplifiers 10 and 11, respectively (FIG. 2), and are available as stereo outputs at stereo output terminals 13 and 14 on analog IC 50. Stereo output terminals 13, 14 may be connected to external headphones 22. A mono analog signal input from audio IC 60 is input to mono analog input terminal 9 on analog IC 50 and passes through isolation amplifier 12 (FIG. 2) becoming available as an analog mono output signal on mono analog output terminal 15. Terminal 15 may be connected to an external speaker 21.

Audio IC 60 provides analog IC 50 with a mono mute signal 16 and a stereo mute signal 17. A suspend signal 18 from an external computer, microprocessor or hard-wired control line (operator manual input) is available to both audio IC 60 and analog IC 50. Suspend signal 18 may alternatively be made available only at audio IC 60 at suspend input terminal 19, or as a global enable input signal only on enable input terminal 20 on analog IC 50. Suspend signal 18 functions to provide power management control to analog IC 50 and audio IC 60. Upon receiving the global enable input signal on enable input terminal 20, analog IC 50 performs power management functions described below.

Figure 2:
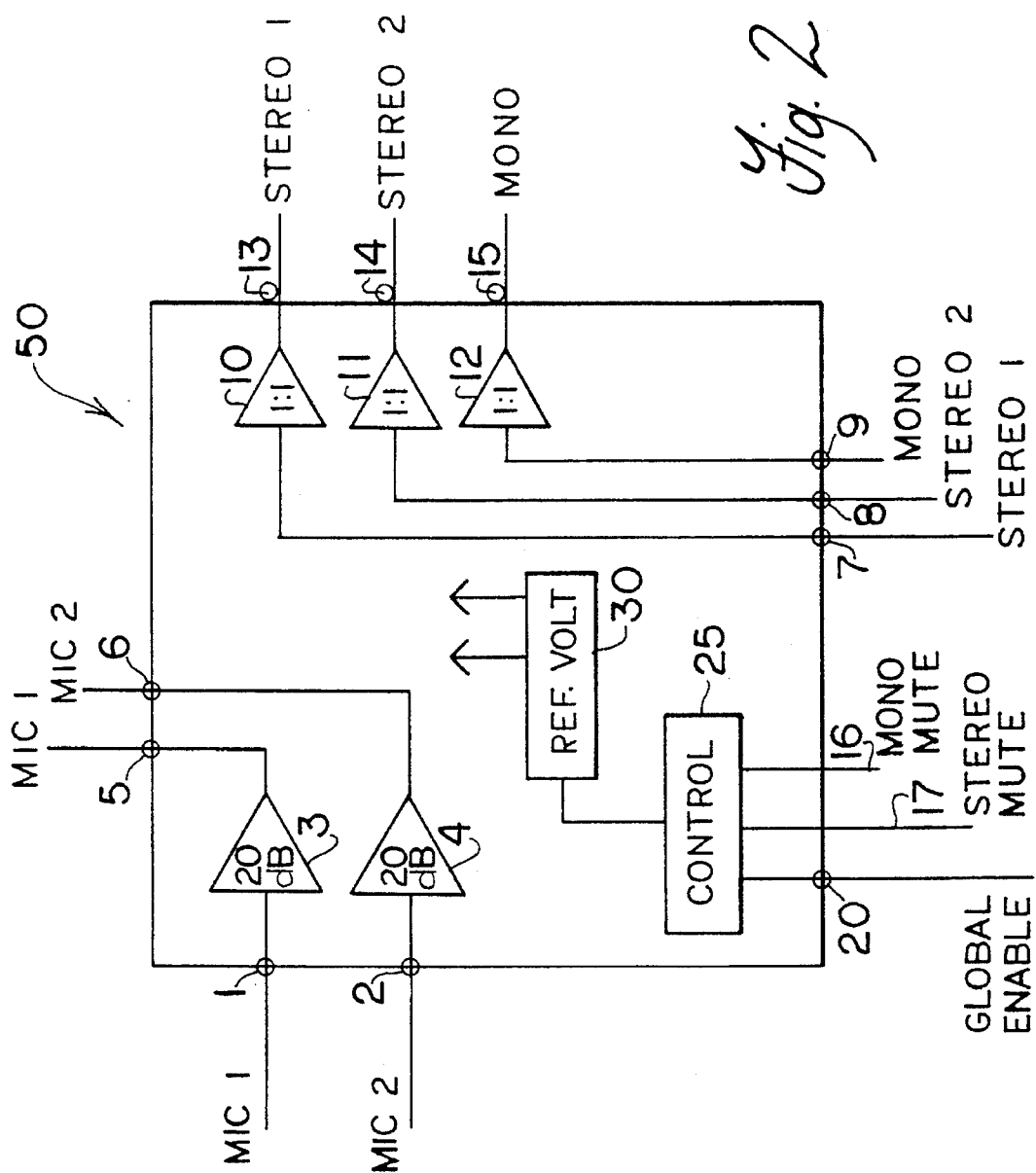
FIG. 2 is schematically illustrates the various functions included in the analog integrated circuit of the present invention.

Referring to FIG. 2, control block 25 provides the analog output and power-down functions which are generated upon receipt of the global enable signal on enable input terminal 20 power to the amplifier circuits is shutdown such that power consumption is virtually zero on analog IC 50. Audio IC 60 provides a stereo mute signal on stereo mute input terminal 17 and a mono mute signal on mono mute input terminal 16. Reference voltages for analog IC 50 are generated by voltage reference generation circuit 30. These voltage references are used throughout the analog IC.

The foregoing disclosure and description of the invention are illustrative and explanatory of the preferred embodiments, and changes in the individual components, circuit elements, connections and construction may be made without departing from the spirit of the invention.

What is claimed is:

1. A monolithic analog integrated circuit comprising:
   a mono analog input terminal;
   a mono analog output terminal;
   a plurality of stereo input terminals;
   a plurality of stereo output terminals;
   at least one microphone input terminal;
   at least one microphone output terminal;
   an isolation amplifier circuit disposed between each said stereo input terminals and output terminals and between said mono analog input terminal and output terminal;
   an operational amplifier circuit disposed between said microphone input terminal and output terminal; and
   a control circuit connected to control signals input to said analog integrated circuit which causes power supplied to said isolation amplifier circuit and operational amplifier circuits to be reduced.

2. The analog integrated circuit of claim 1, further comprising a reference voltage generation circuit connected to said control circuit for providing reference voltages to said isolation amplifiers and operational amplifiers.

3. The analog integrated circuit of claim 1, wherein said control circuit utilizes a global enable input signal to perform power management functions on said analog integrated circuit.

4. The analog integrated circuit of claim 1, wherein said control circuit utilizes a stereo mute input signal to perform power management functions on said analog integrated circuit.

5. The analog integrated circuit of claim 1, wherein said control circuit utilizes a global enable input signal, a stereo mute input signal and a mono mute input signal to perform power management functions on said analog integrated circuit.

6. The analog integrated circuit of claim 5, wherein said enable and mute input signals are output from an external audio signal processing integrated circuit.

7. The analog integrated circuit of claim 5, wherein said global enable, stereo mute and mono mute input signals are digital control signals output from an external audio signal processing integrated circuit.

8. The analog integrated circuit of claim 1, wherein said control circuit utilizes a mono mute input signal to perform power management functions on said analog integrated circuit.

9. A monolithic analog integrated circuit, comprising:
   a plurality of stereo input terminals adapted to receive stereo signals output from an external audio signal processing integrated circuit;
   a mono analog input terminal adapted to receive a mono analog signal output from said external audio signal processing integrated circuit;
   a plurality of stereo mute and mono mute input terminals adapted to receive stereo and mono mute signals output from said external audio signal processing integrated circuit;
   a microphone input terminal adapted to receive a microphone signal output from an external microphone;
   a microphone output terminal adapted to transmit said microphone signal to said external audio signal processing integrated circuit;
   whereby said analog integrated circuit and said external audio signal processing integrated circuit are disposed within a personal computer.

10. The analog integrated circuit of claim 9, wherein said analog integrated circuit and said external audio signal processing integrated circuit are disposed within a single motherboard.

11. The analog integrated circuit of claim 9, wherein said external audio signal processing integrated circuit includes a CODEC module.

12. The analog integrated circuit of claim 9, wherein said external audio signal processing integrated circuit includes a synthesizer module.

13. The analog integrated circuit of claim 12, wherein said synthesizer module comprises a wavetable synthesizer for processing audio signals.

* * * * *